United States Patent
Seo et al.

(10) Patent No.: US 8,027,217 B2
(45) Date of Patent: Sep. 27, 2011

(54) SUPPLY VOLTAGE DISTRIBUTION SYSTEM WITH REDUCED RESISTANCE FOR SEMICONDUCTOR DEVICES

(76) Inventors: Donghyun Seo, Seoul (KR); Jaeyong Cha, Seorgnam-Si (KR)

( * ) Notice: Subject to any disclaimer, the term of this patent is extended or adjusted under 35 U.S.C. 154(b) by 645 days.

(21) Appl. No.: 11/881,505

(22) Filed: Jul. 27, 2007

(65) Prior Publication Data
US 2008/0049533 A1    Feb. 28, 2008

(30) Foreign Application Priority Data
Jul. 27, 2006  (EP) ........................... 06117949

(51) Int. Cl.
G11C 7/00    (2006.01)
(52) U.S. Cl. ......... 365/226; 365/227; 365/228; 365/229
(58) Field of Classification Search ................... 365/226, 365/227, 228, 229
See application file for complete search history.

(56) References Cited

U.S. PATENT DOCUMENTS

| | | | | |
|---|---|---|---|---|
| 4,691,123 A | * | 9/1987 | Hashimoto | 327/546 |
| 4,730,122 A | * | 3/1988 | Dreibelbis et al. | 307/75 |
| 4,833,341 A | * | 5/1989 | Watanabe et al. | 327/541 |
| 5,289,425 A | | 2/1994 | Horiguchi et al. | |
| 5,367,487 A | * | 11/1994 | Yoshida | 365/189.09 |
| 5,430,682 A | * | 7/1995 | Ishikawa et al. | 365/226 |
| 5,781,473 A | * | 7/1998 | Javanifard et al. | 365/185.18 |
| 5,838,627 A | | 11/1998 | Tomishima et al. | |
| 5,883,797 A | * | 3/1999 | Amaro et al. | 363/65 |
| 6,459,643 B2 | * | 10/2002 | Kondo et al. | 365/226 |
| 6,550,038 B2 | * | 4/2003 | Shirata | 716/136 |
| 6,560,157 B2 | * | 5/2003 | Sugita et al. | 365/226 |
| 7,002,870 B2 | * | 2/2006 | Hsu | 365/227 |
| 7,802,141 B2 | * | 9/2010 | Yamamoto et al. | 714/30 |
| 2005/0083762 A1 | | 4/2005 | Ikai et al. | |
| 2005/0117379 A1 | | 6/2005 | Kang | |

OTHER PUBLICATIONS

European Search Report for EP 06 11 7949 dated Feb. 22, 2007.

* cited by examiner

*Primary Examiner* — VanThu Nguyen
(74) *Attorney, Agent, or Firm* — Schwegman, Lundberg & Woessner, P.A.

(57) ABSTRACT

A supply voltage distribution system for distributing a supply voltage through a semiconductor device, the supply voltage distribution system comprising: a first supply voltage distribution line arrangement and a second supply voltage distribution line arrangement, said first supply voltage distribution line arrangement and said second supply voltage distribution line arrangement being adapted to receive from outside the semiconductor device a semiconductor device supply voltage and to distribute a supply voltage to respective first and second portions of the semiconductor device; a voltage-to-voltage conversion circuit connected to the first supply voltage distribution line arrangement, wherein the voltage-to-voltage conversion circuit is adapted to either transfer onto the first supply voltage distribution line arrangement the semiconductor device supply voltage received from outside the semiconductor device, or to put on the first supply voltage distribution line a converted supply voltage having a value different from the semiconductor device supply voltage, wherein the voltage-to-voltage conversion circuit further comprises means selectively activatable for causing the first supply voltage distribution line arrangement to be electrically coupled to said second supply voltage distribution line arrangement.

21 Claims, 3 Drawing Sheets

SUPPLY VOLTAGE DISTRIBUTION SYSTEM WITH REDUCED RESISTANCE FOR SEMICONDUCTOR DEVICES

PRIORITY CLAIM

This application claims priority from European patent application No. EP06117949.5, filed Jul. 27, 2006, which is incorporated herein by reference.

TECHNICAL FIELD

An embodiment of the present invention relates to the field of semiconductor devices and Integrated Circuits (ICs). More specifically, an embodiment of the present invention relates to semiconductor devices and ICs supporting different supply voltages.

BACKGROUND

Semiconductor devices, such as semiconductor memory devices, can be designed so as to be capable of supporting different supply voltages, depending on the intended application. For example, dual-power-supply semiconductor devices (such as, for example, flash memory ICs) can operate with either a first, higher supply voltage (e.g., 3V) or a second, lower supply voltage (e.g., 1.8V).

Operation at a lower supply voltage is for example typical of battery-powered systems, and allows reducing the power consumption.

In both cases, the (lower or higher) supply voltage is fed to the internal circuitry of the semiconductor device, through supply-voltage distribution lines, which are adapted to distribute the supply voltage through the device.

In particular, a known design rule provides for having supply-voltage distribution lines for distributing the supply voltage to the device's core circuitry, comprising key circuital structures adapted for performing the desired tasks (like, in the case of memory devices, memory cells row and column selectors, sense amplifiers, control logic controlling the memory device operation), which are distinct from supply-voltage distribution lines for distributing the supply voltage to input/output circuits, like input/output buffers. By this measure, it is possible to reduce the risk that the operation of the core circuitry is affected by noise on the supply voltage produced by the switching of the input/output circuits. In other words, dedicated supply-voltage distribution lines are used for the core circuitry and the input/output circuits, for decoupling the disturbs occurring during the input/output buffers operation from the remaining circuitry of the semiconductor device.

In order to reduce power consumption, the internal circuitry, particularly the core circuitry of dual-power-supply devices is typically designed to operate with a supply voltage that is lower than the first, higher supply voltage (for example, the internal circuitry of the semiconductor device voltage may be designed to operate with an internal supply voltage of 2.3V, which is intermediate between the first, higher supply voltage and the second, lower supply voltage). For down-converting the external, higher supply voltage into the (lower) internal voltage, a Voltage Down-Converter "VDC" is provided for, which is able to lower the voltage (e.g., starting from the external voltage of 3V, the VDC generates the internal voltage of 2.3V). The VDC has also the function of stabilizing the internal supply voltage of the semiconductor device.

On the other hand, those parts of the circuitry of the semiconductor device that, like input/output buffers, are used for interfacing the semiconductor device with the external environment (typically a system bus), need to be supplied at either the first, higher supply voltage, or to the second, lower supply voltage, depending on the environment in which the semiconductor device is inserted. Voltage-level adapters (shifters) are provided for interfacing the core circuitry with the input/output circuits.

When the semiconductor device is employed in low-supply voltage applications, the internal circuitry of the semiconductor device should be supplied by a supply voltage equal to the external supply voltage. A voltage switch is provided for the electrical connection between the supply-voltage distribution line that receives (from the semiconductor device terminals) the externally supplied supply voltage and the supply-voltage distribution line that distributes the supply voltage to the core circuitry; the VDC is in this case kept off, and bypassed by the voltage switch.

The dual-power-supply semiconductor device is typically configured for either a lower-voltage application or a higher-voltage application during the testing, for example by burning a fuse in a control structure that controls the activation of the VDC or, in alternative, of the voltage switch.

Typically, the voltage switch is implemented by a MOS transistor, particularly of p-type conductivity (i.e., a PMOS), which is connected between the semiconductor device terminals that, in operation, are connected to the supply-voltage distribution line that receives the externally supplied supply voltage and the supply-voltage distribution line distributing the supply voltage to the core circuitry, and has a control (i.e. a gate) terminal receiving the control signal. When, as a consequence of the semiconductor device configuration during the testing, the PMOS transistor is turned on, the low supply voltage received from the supply-voltage distribution line is fed to the core circuitry.

The voltage switch has a resistance (the PMOS transistor on resistance) that inevitably causes a voltage drop across it. Thus, the actual internal supply voltage, which is fed to the core circuitry, is often lower than the external low supply voltage.

SUMMARY

A drawback of the above-described solution is that in order to reduce the voltage drop across the voltage switch, the resistance of the MOS transistor should be kept as low as possible. This however has a detrimental impact on the size of the semiconductor device, and thus on the IC chip size, since the on-resistance of a MOS transistor typically decreases with the increase in size of the MOS transistor.

Moreover, when the size of the MOS transistor is increased, the size of the supply-voltage distribution lines which are connected thereto may be increased as well. This may result in a further increase in the IC chip area and at the same time may have a detrimental impact on the resistance of the supply-voltage distribution lines (since the resistance thereof increases as they become longer).

A further problem of the above-described solution is that in order to reduce the overall resistance due to both the voltage switch and the supply-voltage distribution lines, the complexity of the floor plan (i.e., the design of the IC layout) may be increased.

In general, an embodiment of the present invention is based on the idea that, in low-supply-voltage applications, the supply voltage for the core circuitry of the semiconductor device can be derived also from the supply-voltage distribution line(s) dedicated to supplying the input/output circuits of the semiconductor device.

In detail, an embodiment of the present invention proposes a supply-voltage distribution system for distributing a supply voltage through a semiconductor device. The supply-voltage distribution system comprises: a first supply-voltage distribution line arrangement and a second supply-voltage distribution line arrangement, said first supply-voltage distribution line arrangement and said second supply-voltage distribution line arrangement being adapted to receive from outside of the semiconductor device a semiconductor-device supply voltage and to distribute a supply voltage to respective first and second portions of the semiconductor device; a voltage-to-voltage conversion circuit connected to the first supply-voltage distribution-line arrangement, wherein the voltage-to-voltage conversion circuit is adapted to either transfer onto the first supply-voltage distribution-line arrangement the semiconductor-device supply voltage received from outside the semiconductor device, or to put on the first supply-voltage distribution line a converted supply voltage having a value different from the semiconductor device supply voltage. The voltage-to-voltage conversion circuit further comprises means selectively activatable for causing the first supply-voltage distribution-line arrangement to be electrically coupled to said second supply-voltage distribution line arrangement.

DETAILED DESCRIPTION

Figure 1:
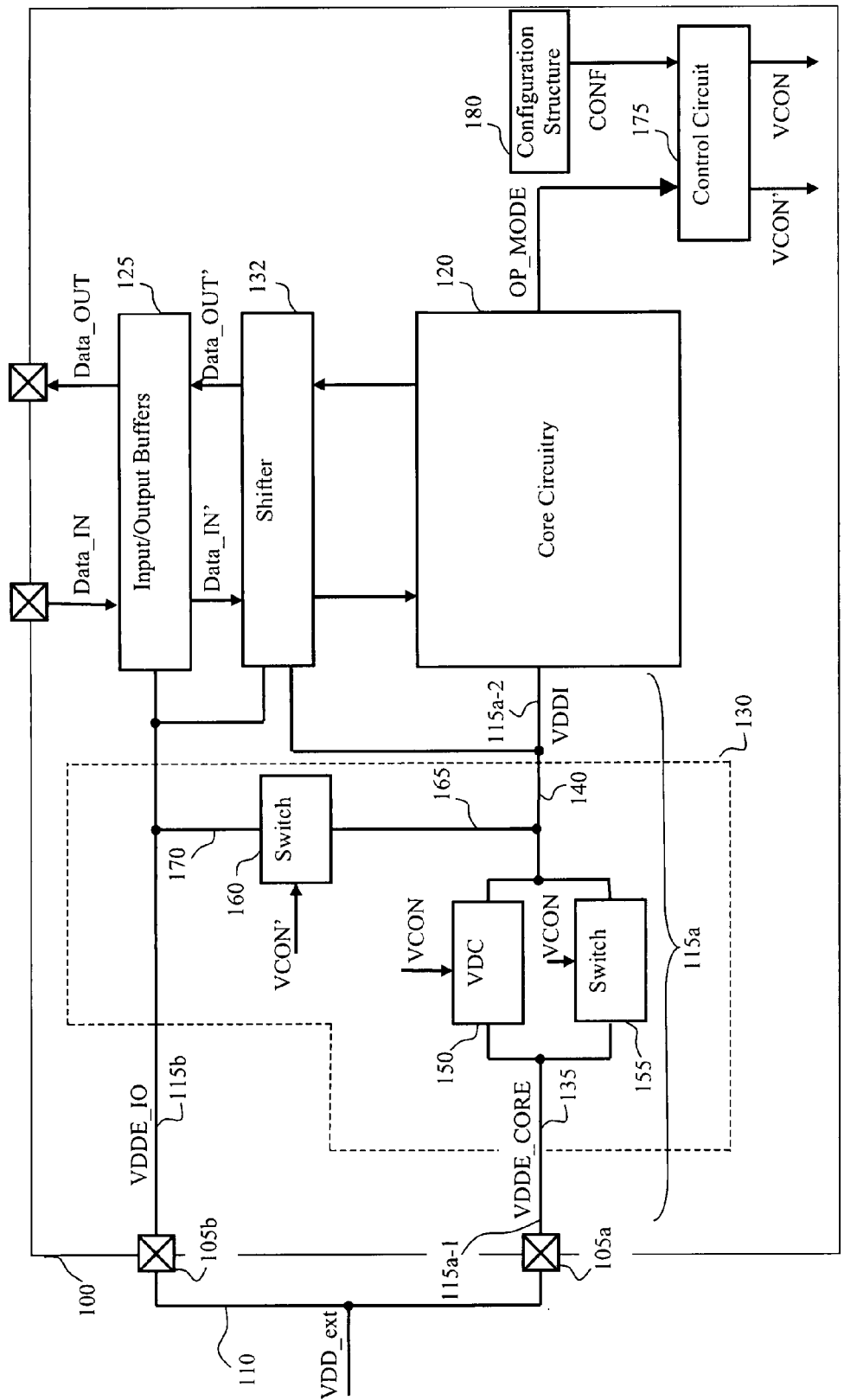
FIG. 1 schematically shows a semiconductor device according to an embodiment of the present invention.

Referring to FIG. 1, a semiconductor device 100 according to an embodiment of the present invention is shown. The semiconductor device 100 is integrated in a semiconductor material, typically silicon, chip. For example, but not limitatively, the semiconductor device 100 may be a semiconductor memory, like a non-volatile memory, e.g. a Flash memory.

The semiconductor device 100 is a dual-power-supply device, i.e. it is designed so as to be capable of operating with different supply voltages, depending on the intended application. For example, the semiconductor device 100 may operate with a first, higher-supply voltage, e.g. of 3V nominally, or with a second, lower supply voltage, e.g. of 1.8V nominally. It is pointed out that, more generally, the semiconductor device 100 might be designed so as to be able of operating with more then two different voltage supplies.

The semiconductor device 100 has first terminals 105$a$ and second terminals 105$b$ (typically, metal pads of the IC), intended for the connection to an external power-supply voltage-distribution line 110 of the electronic system where the semiconductor device 100 has to be inserted.

The first terminals 105$a$ are connected to a first supply-voltage-distribution-line arrangement 115$a$, and the second terminals 105$b$ are connected to a second supply-voltage-distribution-line arrangement 115$b$, which are provided internally to the semiconductor device IC for distributing the supply voltage that, in use, is received from the outside through the external power-supply-voltage distribution line 110.

In particular, the first supply-voltage-distribution-line arrangement 115$a$ is provided for distributing the supply voltage to a first portion of the semiconductor device 100, like for example a core circuitry 120 of the semiconductor device 100. For example, in the case of a memory device, the core circuitry 120 may include address decoders, memory cell matrix rows and columns selectors, sensing circuits, programming circuits, control circuits. The second supply-voltage-distribution-line arrangement 115$b$ is instead provided for distributing the supply voltage to a second portion of the semiconductor device 100 comprising for example interface circuits of the semiconductor device 100, particularly input/output buffers 125, for example, input buffers for receiving from the outside addresses of memory locations, and input/output buffers for outputting data read from the memory locations, or for inputting data to be written into the memory locations of the semiconductor device 100.

The external power-supply-voltage distribution line 110 supplies a voltage VDD_ext, which, as described above, depending on the intended application, may take the first, higher value of, e.g., 3V, or the second, lower value of, e.g., 1.8V. The voltage VDD_ext is distributed internally to the semiconductor device 100 by the first and second supply-voltage-distribution-line arrangements 115$a$ and 115$b$. In the following, the voltage received by the first supply-voltage-distribution-line arrangement 115$a$ from the terminals 105$a$ will be referred to as VDDE_CORE, whereas the voltage received (and distributed) by the second supply-voltage-distribution-line arrangement 115$b$ from the terminals 105$b$ will be referred to as VDDE_IO.

The core circuitry 120 of the semiconductor device is assumed to be designed so as to be capable of operating with a maximum supply voltage that is lower than the first, higher supply voltage, but higher than the second, lower supply voltage. For example, the internal circuitry of the semiconductor device voltage may be designed to operate with an internal supply voltage of 2.3V, which is intermediate between the exemplary values of 3V for the first, higher supply voltage, and of 1.8V for the second, lower supply voltage. This is a known measure that IC designers take so as to trade off operating speed for power consumption (operating at a higher supply voltage increases the speed, but also the power consumption).

For this purpose, a voltage-to-voltage conversion circuit 130 is provided in the semiconductor device 100, for supplying the core circuitry 120 with the most appropriate supply voltage, depending on the intended application. The voltage-to-voltage conversion circuit 130 is provided along the first supply-voltage-distribution-line arrangement 115$a$, and is adapted to generate a supply voltage VDDI that is distributed to the core circuitry 120. In greater detail, the first supply-voltage-distribution-line arrangement 115$a$ comprises a first section 115$a$-1 and a second section 115$a$-2; the first section 115$a$-1 extends from the first terminals 105$a$ to the voltage-to-voltage conversion circuit 130, whereas the second section 115$a$-2 extends from the voltage-to-voltage conversion circuit 130 to the core circuitry 120. The second section 115$a$-2 of the first supply-voltage-distribution-line arrangement 115$a$ is used to distribute the supply voltage VDDI internally to the semiconductor device IC. Depending on the intended application, the supply voltage VDDI may either take the value (e.g., 1.8V) of the external voltage VDD_ext (this occurs in low-supply-voltage applications), or a value (e.g., 2.3V) lower (more generally, different) than the external voltage VDD_ext (this occurs in applications where the external supply voltage is for example equal to 3V).

A voltage-level adapter (shifter) 132 is also provided in the semiconductor device 100, for interfacing the core circuitry 120 with the input/output buffer 125. In particular, the level shifter 132 receives both the supply voltage VDDI and the voltage VDDE_IO, through respectively the first and the second supply-voltage-distribution-line arrangements 115a and 115b.

The input/output buffers 125 are used for interfacing the semiconductor device 100 with the external environment, in particular for receiving input signals DATA_IN (for example in case of the memory Flash, comprising addresses of memory locations, and data to be written into the memory locations of the semiconductor device 100) and outputting output signals DATA_OUT (for example in case of the memory Flash, data read from the memory locations). The voltage levels of the input signals DATA_IN and the output signals DATA_OUT have to be compliant to the value of the external supply voltage VDD_ext, so they depend on the intended application; for example, in case the external supply voltage VDD_ext is equal to 3V, the input signals DATA_IN and the output signals DATA_OUT have to take voltage levels varying between ground and 3V, whereas in case the external supply voltage VDD_ext is equal to 1.8V, the input signals DATA_IN and of the output signals DATA_OUT have to take voltage levels varying between ground and 1.8V.

Since as mentioned above the core circuitry 120 operates at the supply voltage VDDI that, when the external voltage VDDE_ext is equal to e.g. 3V, is lower than 3V, being for example of 2.3V, the shifter 132 is adapted to shift (lower) the voltage of the input signals DATA_IN' from the input/output buffers 125, to make them compliant with the supply voltage of the core circuitry 120, and to shift (increase) the voltage of the output signals DATA_OUT' from the core circuitry 120 so as to make them compliant with the value of the external supply voltage VDD_ext.

In applications where the external supply voltage VDD_ext takes the second, lower value of, e.g., 1.8V, the core circuitry 120 operates with a supply voltage VDDI of value equal to the voltage VDDE_ext, thus the shifter 132 leaves the signals' voltage levels untouched.

In greater detail, the voltage-to-voltage conversion circuit 130 has an input terminal 135 which is connected to the first section 115a-1 of the first supply-voltage-distribution-line arrangement 115a thus receiving the voltage VDDE_CORE, and an output terminal 140 which is connected to the second section 115a-2 of the first supply-voltage-distribution-line arrangement 115a.

As mentioned above, in applications where the external voltage VDD_ext takes the first, higher voltage value of, e.g., 3V, the voltage-to-voltage conversion circuit 130 is adapted to lower the voltage VDDE_CORE; for example, starting from the external voltage of 3V, the voltage-to-voltage conversion circuit 130 is adapted to lower the external supply voltage value to a value sustained by the core circuitry 120, for example 2.3V; on the contrary, in applications where the external voltage VDD_ext takes the second, lower voltage, the voltage-to-voltage conversion circuit 130 transfers the voltage VDDE_CORE present on the first section 115a-1 of the first supply-voltage-distribution-line arrangement 115a to the second section 115a-2, so that the supply voltage VDDI is equal to the voltage VDD_ext.

The voltage-to-voltage conversion circuit 130 comprises a VDC 150 which is connected between the input terminal 135 and the output terminal 140 of the voltage-to-voltage conversion circuit 130; the activation of the VDC 150 is controlled by a first control signal VCON, which, according to assertion state thereof, causes the VDC 150 to generate the proper voltage value for the supply voltage VDDI to be fed to the core circuitry 120.

The voltage-to-voltage conversion circuit 130 further comprises a first voltage switch 155 (for example implemented by one or more MOS transistors, e.g., PMOS transistors) which is connected in parallel to the VDC 150. The first voltage switch 155 receives and is controlled by the first control signal VCON and, according to assertion state of this signal, the first switch 155 connects the input terminal 135 to the output terminal 140 of the voltage-to-voltage conversion circuit 130. More in particular, when the assertion state of the first control signal VCON is such that the VDC 150 is activated, the first voltage switch 155 is off (open-circuit); vice versa, when the assertion state of the first control signal VCON is such that the VDC 150 is de-activated, the first voltage switch 155 is on, thus providing an electrical connection between the input terminal 135 and the output terminal 140 (so by-passing the VDC 150). In other words, the VDC 150 and the first voltage switch 155 operate in mutually exclusive manner.

The voltage-to-voltage conversion circuit 130 further includes a second voltage switch 160 (for example implemented by one or more further MOS transistors, e.g., PMOS transistors) having a first terminal 170 which is connected to the second supply-voltage-distribution-line arrangement 115b thus receiving the voltage VDDE_IO, and a second terminal 165 which is connected to the output terminal 140, and thus to the second section 115a-2 of the first supply-voltage-distribution-line arrangement 115a. The second voltage switch 160 receives and is controlled by a second control signal VCON' and, according to assertion state thereof, electrically connects the first terminal 170 to the second terminal 165, thereby transferring the voltage VDDE_IO present on the second supply-voltage-distribution-line arrangement 115b to the second section 115a-2 of the first supply-voltage-distribution-line arrangement 115a.

A voltage-to-voltage conversion control circuit 175 is provided, adapted to generate the first control signal VCON and the second control signal VCON'. The control circuit 175 is responsive to an operating mode signal(s) OP_MODE received from the core circuitry 120 and on a semiconductor-device configuration signal(s) CONF received from a configuration structure 180, comprising for example fuses. In particular, the operating mode signal(s) OP_MODE is adapted to indicate an operating mode of the semiconductor device 100: for example, the operating mode signal OP_MODE is de-asserted to indicate that the core circuitry 120 is operating simultaneously to the input/output buffers 125 (i.e., the input/output buffers 125 are active, because a transfer of data received from outside to the core circuitry, and/or a transfer of data received from the core circuitry and to be outputted is taking place); vice versa the operating mode signal OP_MODE is asserted to indicate that the input/output buffers 125 and the core circuitry 120 are not operating simultaneously (i.e., the input/output buffers 125 are inactive, since no transfer of data received from outside to the core circuitry, nor transfer of data received from the core circuitry and to be outputted is taking place). During the configuration of the semiconductor device 100, for example during the post-manufacturing testing of the IC, the configuration structure 180 is set so that, in operation the configuration signal CONF takes the state corresponding to the intended application; for example, this may involve burning one or more fuses. For example, the configuration signal CONF may take an asserted state when the semiconductor device 100 is configured for applications in which the external supply voltage takes the first, higher value, whereas the configuration signal CONF may take a de-asserted state when the semiconductor device is configured for applications in which the external supply voltage takes the second, lower value.

In particular, the first control signal VCON depends on the configuration signal CONF, i.e. on the device configuration stored in the configuration structure 180; the second control signal VCON' depends as well on the configuration signal CONF, but also on the operating mode signal OP_MODE, and thus on the operating mode of the semiconductor device 100.

In operation, when the configuration signal CONF is asserted (meaning that the semiconductor device 100 is configured for applications in which the external supply voltage VDD_ext takes the first, higher value), the first control signal VCON is asserted; vice versa, when the configuration signal CONF is de-asserted (meaning that the semiconductor device 100 is configured for applications in which the external supply voltage VDD_ext takes the second, lower value) the first control signal VCON is de-asserted. The second control signal VCON' is asserted when the configuration signal CONF is de-asserted (meaning that the semiconductor device 100 is configured for applications in which the external supply voltage VDD_ext takes the second, lower value) and the operating mode signal OP_MODE is asserted (meaning that the input/output buffers 125 and the core circuitry 120 are not operating simultaneously); in all the other cases, the second control signal VCON' is de-asserted.

As described above, the semiconductor device 100 may operate with a first, higher supply voltage, e.g. of 3V, or with a second, lower supply voltage, e.g. of 1.8V.

When the semiconductor device 100 has been configured for applications in which the external voltage VDD_ext takes the first, higher supply voltage, e.g. of 3V, the configuration signal CONF is asserted. In this condition, the voltage-to-voltage conversion control circuit 175 asserts the first control signal VCON and de-asserts the second control signal VCON'. The first and second voltage switches 155 and 160 are both off, and the VDC 150 is activated; the VDC 150 converts the voltage VDDE_CORE, e.g. of 3V, received on the first section 115a-1 of the first supply voltage distribution line arrangement 115a, into the supply voltage VDDI, e.g. 2.3V, and this voltage is distributed to the core circuitry 120 on the second section 115a-2. For example, during the operation, the core circuitry 120 is able to perform the intended tasks operating with the voltage of 2.3V; for example, the core circuitry 120 may receive address signals of memory locations to be read/written, access the addressed locations, read/write data therefrom/thereinto, and sending to the shifter 132 the output signals DATA_OUT (such as data stored in memory locations of the Flash memory). The level shifter 132 properly shifts the voltage levels of the signals, so that, at the output of the shifter 132, the output signals DATA_OUT are compliant with the external supply voltage.

Since the second control signal VCON' is de-asserted, the second voltage switch 160 is off, and no electrical connection results between the second supply voltage distribution line arrangement 115b carrying the voltage VDDE_IO and the second section 115a-2 of the first supply-voltage-distribution-line arrangement 115a carrying the voltage VDDI.

When the semiconductor device 100 has been configured for applications in which the external voltage VDD_ext takes the second, lower supply voltage, e.g. of 1.8V, the configuration signal CONF is de-asserted. In this condition, the voltage-to-voltage conversion control circuit 175 de-asserts the first control signal VCON so that the first voltage switch 155 is kept on, whereas the VDC 150 is de-activated and by-passed.

In particular, the first voltage switch 155 electrically connects the input terminal 135 of the voltage-to-voltage conversion circuit 130 to the output terminal 140 thereof so that the internal supply voltage VDDI is equal to the second, lower supply voltage.

When the operation mode signal OP_MODE is asserted (to indicate that the input/output buffers 125 and the core circuitry 120 are not operating simultaneously), the voltage-to-voltage conversion control circuit 175 asserts the second control signal VCON', and thus the second voltage switch 160 is kept on. In such a way, the second supply-voltage-distribution-line arrangement 115b, distributing the voltage VDDE_IO to the input/output circuits 125, is coupled to the second section 115a-2 of the first supply-voltage-distribution-line arrangement 115a, carrying the supply voltage VDDI to the core circuitry 120. It is observed that since in this operating condition the core circuitry 120 and the input/output buffers 125 are not operating simultaneously, the latter do not induce disturbs on the voltage VDDE_IO, and thus no disturbs are induced on the supply voltage VDDI that supplies the core circuitry 120; thus, the correct operation of the core circuitry 120 is not impaired by the connection of the second section 115a-2 of the first supply-voltage-distribution-line arrangement 115a to the second supply-voltage-distribution-line arrangement 115b.

When instead the operation-mode signal OP_MODE is de-asserted (to indicate that the input/output buffers 125 and the core circuitry 120 are operating simultaneously), the voltage-to-voltage conversion control circuit 175 de-asserts the second control signal VCON' so that the second voltage switch 160 is kept off (open circuit). In such a way, there is no electrical connection between the second supply-voltage-distribution-line arrangement 115b distributing the voltage VDDE_IO to the input/output buffers 125 and the second section 115a-2 of the first supply-voltage-distribution-line arrangement 115a distributing the voltage VDDI to the core circuitry 120. As a result, the core circuitry 120 and the input/output buffers 125 can operate simultaneously without the disturbs on the voltage VDDE_IO produced by the switching of the input/output buffers propagating on the supply voltage VDDI that supplies the core circuitry 120 (these disturbs might impair the correct operation of the core circuitry 120).

Figure 2:
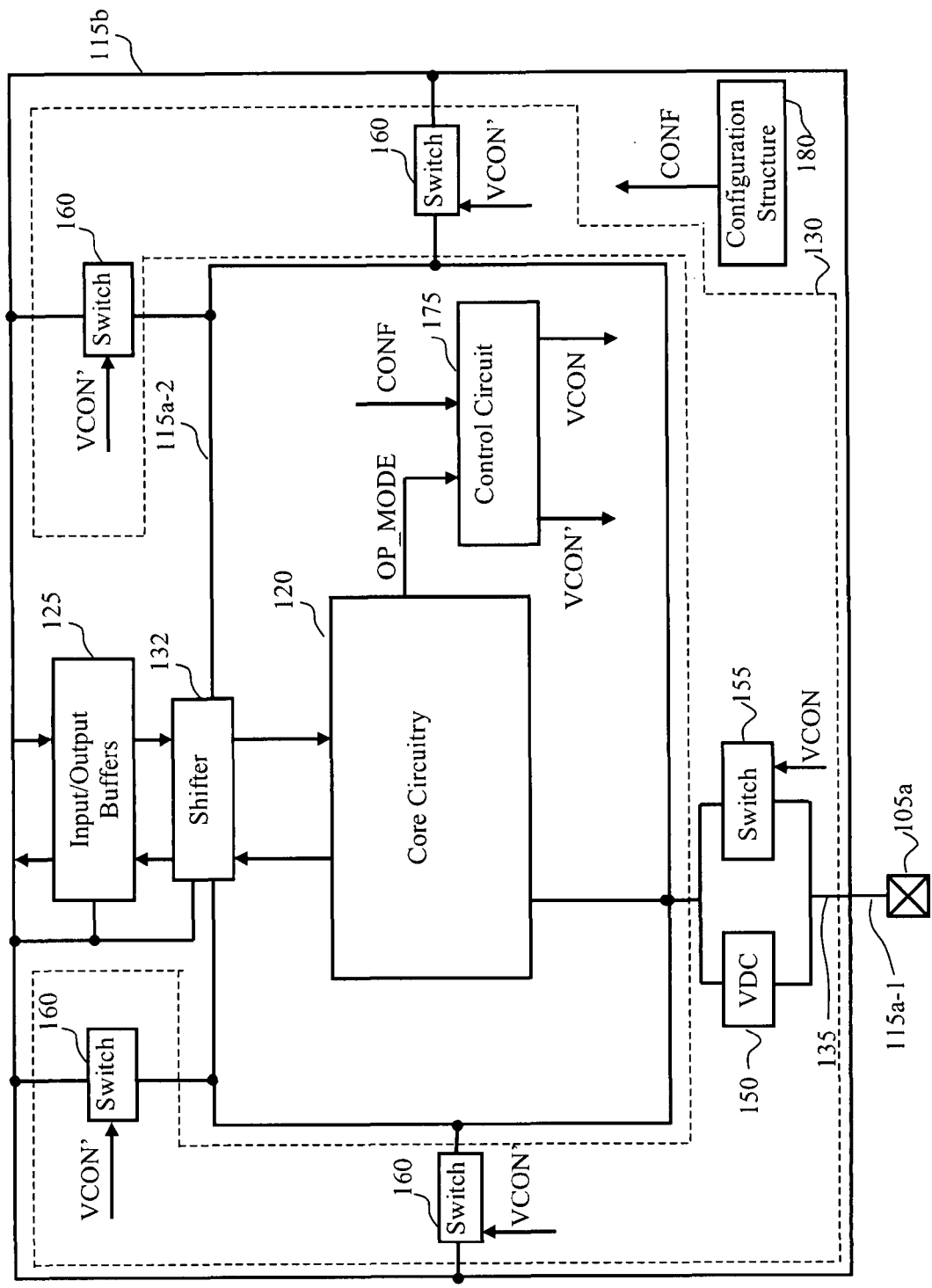
FIG. 2 schematically shows a layout of power-supply distribution lines for the semiconductor device of FIG. 1, according to an embodiment of the present invention.

Moving now to FIG. 2, a layout of power-supply distribution lines for the semiconductor device of FIG. 1, according to an embodiment of the present invention is shown. Elements identical or similar to those shown in FIG. 1 are denoted by the same reference numerals.

The second supply-voltage-distribution-line arrangement 115b has a generic ring shape (in the shown example, the ring has a generic rectangular shape, and it is closed, however this is not to be intended as a limitation of the invention), and surrounds a region of the IC chip wherein the core circuitry 120, the level shifter 132, the input/output buffers 125 and the configuration structure 180 are integrated; in particular, the second supply-voltage-distribution-line arrangement 115b may run along a periphery of the IC.

The second section 115a-2 of the first supply-voltage-distribution-line arrangement 115a has, similarly to the second supply-voltage-distribution-line arrangement 115b, a generic ring shape (in the shown example, the ring formed by the second section 115a-2 has as well a generic rectangular shape, and it is closed, however this is not to be intended as a limitation of the invention), and extends internally to the second supply voltage distribution line arrangement 115b.

The core circuitry 120 is integrated in a region of the IC chip surrounded by the second section 115a-2 of the first supply-voltage-distribution-line arrangement 115a. The voltage-to-voltage conversion control circuit 175 is as well integrated in this region of the IC chip.

The input/output buffers 125 are instead integrated along the periphery of the IC chip.

The first section 115a-1 of the supply voltage distribution line arrangement 115a occupies a narrow region of the IC chip, sufficient for connecting the IC first terminals 105a to the first input terminal 135 of the voltage-to-voltage conversion circuit 130.

According to an embodiment of the present invention, the voltage-to-voltage conversion circuit 130 includes a distributed arrangement of a plurality (in the shown example, four) of voltage switches 160, distributed along and connected to the second supply voltage distribution line arrangement 115b and the second section 115a-2 of the first supply voltage distribution line arrangement 115a (in the schematic drawing, the voltage switches 160 are provided along three of the four sides of the rectangular rings forming the second supply voltage distribution line arrangement 115b and the second section 115a-2 of the first supply voltage distribution line arrangement 115a, however it is underlined that this arrangement of voltage switches is merely exemplary). Each second voltage switch 160 receives the second control signal VCON' from the voltage-to-voltage conversion control circuit 175.

As can be noted, the first voltage switch 155 is connected between the first section 115a-1 of the supply voltage distribution line arrangement 115a carrying the voltage VDD_ext and the second section 115a-2 of the supply voltage distribution line arrangement 115a distributing the internal supply voltage VDDI, whereas each second voltage switch 160 is connected between the second supply voltage distribution line arrangement 115b carrying the voltage VDD_ext and the second section 115a-2 of the supply voltage distribution line arrangement 115a. In particular, the voltage switches 160 are parallel-connected each other and are also parallel-connected to the first voltage switch 155. In such a way, the overall resistance of the circuital pathways connecting the second supply voltage distribution line arrangement 115b to the second section 115a-2 of the supply voltage distribution line arrangement 115a is reduced so that the voltage drop across the switches 155 and 160 is reduced. Such reduction of the resistance is obtained without any increment of the size of the PMOS transistor which is used for implementing each one of the switches 155 and 160.

Thus, in operation, when the external voltage VDD_ext takes the second, lower supply voltage, e.g. of 1.8V, the actual supply voltage VDDI, which is fed to the core circuitry, is substantially equal to the external low supply voltage, thanks to the contribution of the second supply voltage distribution line arrangement 115b and to the distribution of the supply voltage VDDI to the core circuitry 120.

The feature of having one or more second switches 160 within the voltage-to-voltage conversion circuit 130 has a beneficial impact on the size of each supply voltage distribution line arrangements supplying the switches 155 and 160. In particular, by using the proposed solution it is possible to reduce the length of each supply voltage distribution line arrangement, thus reducing the corresponding resistance.

Moreover, in an embodiment of the invention, the selective activation of the second voltage switch 160 conditioned on the fact that the input/output buffers 125 are not switching reduces or eliminates propagation of the disturbs caused by the input/output buffers switching to the core circuitry 120 of semiconductor device 100.

Naturally, in order to satisfy local and specific requirements, a person skilled in the art may apply to the solution described above many modifications and alterations. Particularly, although the present invention has been described with a certain degree of particularity with reference to one or more embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, although in the preceding preferred description reference has been made to the selective activation of the second switch 160 based on an indication of the operating mode of the semiconductor device, it is not to be construed as a limitation of the present invention.

In any case, one or more embodiments of the invention are suitable to be implemented by using other types of transistors for implementing the first and the second switches.

Alternatively, it is possible to use different exemplificative values for the supply voltage during the operation of the semiconductor device.

Figure 3:
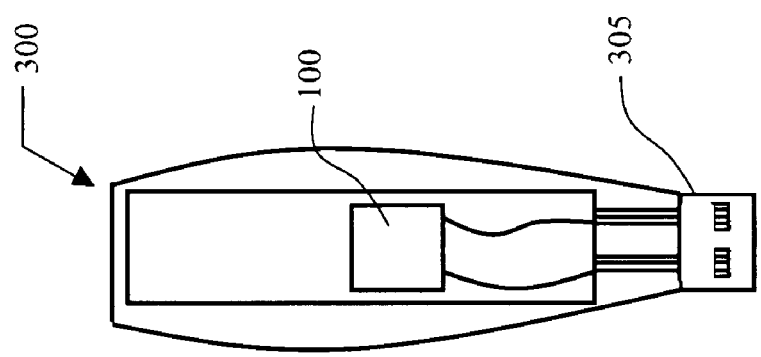
FIG. 3 shows an exemplificative electronic system wherein the semiconductor device according to an embodiment of the present invention is employed.

As mentioned in the foregoing, although applicable in general to any kind of semiconductor device, one or more embodiments of the present invention are in particular applicable to semiconductor devices like semiconductor memories, particularly albeit not limitatively non-volatile memories, e.g. electrically-alterable memories like NAND memories. These kind of devices are nowadays widely used in electronic systems like storage devices like memory cards and USB hard drives, as schematically shown in FIG. 3, schematically illustrating a USB pen 300 with a USB connector 305 adapted to be inserted into a USB port of, e.g., a personal computer, and including a semiconductor device, particularly a semiconductor memory 100 of the type previously described. Alternatively, an integrated circuit incorporating an embodiment of the invention may be coupled to a controller to form part of a system.

The invention claimed is:

1. An integrated circuit, comprising:
   a first node operable to receive a signal;
   a second node operable to receive the signal;
   a first coupler operable to couple the first node to a third node; and
   a second coupler operable to couple the second node to the third node during a first operating condition and independent of the first coupler and operable to uncouple the first node from the third node during a second operating condition;
   the integrated circuit further comprising:
   circuitry coupled to the first node; and
   wherein the second operating condition comprises the circuitry transferring data.

2. The integrated circuit of claim 1 wherein:
   the first coupler is operable to couple the first node to the third node during the second operating condition; and
   the second coupler is operable to couple the second node to the third node simultaneous to the first and third nodes being coupled to each other.

3. The integrated circuit of claim 2 wherein the second operating condition comprises the signal having a pre-established value.

4. The integrated circuit of claim 1 wherein:
the first coupler comprises a switch coupled between the first and third nodes; and
the second coupler comprises multiple switches coupled in parallel between the second and third nodes.

5. The integrated circuit of claim 1 wherein:
the first coupler comprises a transistor coupled between the first and third nodes; and
the second coupler comprises multiple transistors coupled in parallel between the second and third nodes.

6. The integrated circuit of claim 1, further comprising:
circuitry coupled to the third node; and
wherein the first operating condition comprises the circuitry operating in a first pre-established operating mode.

7. The integrated circuit of claim 1 wherein the second coupler is operable to uncouple the first node from the third node during a second operating condition.

8. The integrated circuit of claim 1, further comprising:
a periphery;
wherein the first node comprises a first supply node;
wherein the signal comprises a supply voltage;
wherein the second node comprises a second supply node;
wherein the first supply node comprises a first supply conductor disposed along a portion of the periphery;
wherein the second supply node comprises a second supply conductor disposed adjacent to the first supply conductor;
wherein the first coupler comprises a switch coupled between the first supply node and the third node; and
wherein the second coupler comprises multiple switches distributed along and coupled in parallel between the first and third nodes.

9. The integrated circuit of claim 1 wherein the first coupler is configured to couple the first node to the third node independently of an operating condition.

10. The integrated circuit of claim 1 wherein:
the first node comprises a first supply node;
the signal comprises a supply voltage; and
the second node comprises a second supply node.

11. An integrated circuit, comprising:
a first node operable to receive a signal;
a second node operable to receive the signal;
a first coupler operable to couple the first node to a third node; and
a second coupler operable to couple the second node to the third node during a first operating condition and independent of the first coupler and operable to operable to uncouple the first node from the third node during a second operating condition;
the integrated circuit further comprising:
circuitry coupled to the first node; and
wherein the second operating condition comprises the circuitry generating an unwanted signal on the first node.

12. A system, comprising:
a first integrated circuit, comprising,
a first node operable to receive a signal,
a second node,
a first coupler operable to couple the second node to the first node if the signal comprises a voltage above a voltage threshold, and
a second coupler operable to couple the second node to the first node during a first operating condition if the signal comprises a voltage below the voltage threshold and operable to decouple the second node from the first node during a second operating condition if the signal comprises a voltage below the voltage threshold; and
a second integrated circuit coupled to the first integrated circuit.

13. The system of claim 12, wherein the second integrated circuit comprises a controller.

14. The system of claim 12 wherein the first and second integrated circuits are disposed on a same die.

15. The system of claim 12 wherein the first and second integrated circuits are disposed on respective dies.

16. A method, comprising:
enabling a first conductive path between first and second nodes; and
enabling a second conductive path via a switch between the first and second nodes during a first operating mode and independent of the enabling of the first conductive path; wherein:
enabling the first conductive path comprises enabling the first conductive path during a second operating mode such that circuitry coupled to the first node generates an unwanted signal on the first node; and
enabling the second conductive path comprises enabling the second conductive path simultaneous to the enabling of the first conductive path.

17. The method of claim 15 wherein:
enabling the first path comprises closing a first switch that is coupled between the first and second nodes; and
enabling the second path comprises closing a second switch that is coupled between the first and second nodes.

18. The method of claim 15 wherein:
enabling the first path comprises closing a first switch that is coupled between the first and second nodes; and
enabling the second path comprises closing second and third switches that are coupled in electrical parallel between the first and second nodes.

19. The method of claim 15, further comprising disabling the second path during a second operating mode.

20. The method of claim 15 wherein enabling the first conductive path comprises enabling the first conductive path during all operating conditions.

21. The method of claim 15, further comprising receiving a supply voltage on one of the first and second nodes.

* * * * *